United States Patent [19]
Parker et al.

[11] Patent Number: 5,167,232
[45] Date of Patent: Dec. 1, 1992

[54] MAGNETIC RESONANCE ANGIOGRAPHY BY SEQUENTIAL MULTIPLE THIN SLAB THREE DIMENSIONAL ACQUISITION

[75] Inventors: Dennis L. Parker, Centerville; Duane D. Blatter, Salt Lake City, both of Utah

[73] Assignee: IHC Hospitals, Inc., Salt Lake City, Utah

[21] Appl. No.: 563,987

[22] Filed: Aug. 7, 1990

[51] Int. Cl.⁵ ............................................. A61B 5/55
[52] U.S. Cl. ............................... 128/653.3; 324/306; 324/309
[58] Field of Search ..... 128/653 A, 653 AF, 653 CA, 128/653.2, 653.3, 653.4; 324/306, 309

[56] References Cited

U.S. PATENT DOCUMENTS

| | | | |
|---|---|---|---|
| 4,516,582 | 5/1985 | Redington | 128/653 AF |
| 4,609,872 | 9/1986 | O'Donnell | 324/306 |
| 4,728,891 | 3/1988 | Fujimura et al. | 324/309 |
| 4,739,766 | 4/1988 | Riederer | 128/653 AF |
| 4,746,864 | 5/1988 | Satoh | 324/309 |
| 4,780,674 | 10/1988 | Breton et al. | 324/306 |
| 4,803,431 | 2/1989 | Sano et al. | 128/653 AF |
| 4,837,512 | 6/1989 | Suzuki | 324/306 |
| 4,851,779 | 7/1989 | DeMeester et al. | 324/309 |
| 5,022,397 | 6/1991 | Dumoulin | 128/653 AF |

Primary Examiner—Lee S. Cohen
Assistant Examiner—Krista M. Pfaffle
Attorney, Agent, or Firm—David Black; Eleanor Goodall

[57] ABSTRACT

A method for acquiring image data for three dimensional magnetic resonance angiography using magnitude contrast, ("time-of-flight") imaging techniques allowing for the arbitrary offset of a slab or slabs in a sample, and allowing for the acquisition of multiple thin overlapping slabs using the steps of: selecting an image area on a sample as a one or more thin slabs; applying magnetic gradients to a sample in a logical x, y, and z coordinate system by use of a magetic resonance apparatus; applying radio frequency pulses to the image area within the sample; shifting the slab or slabs (overlapping the slab image area) by rotating the radio frequency pulse for the shifted (overlapping) slab or slabs.

20 Claims, 4 Drawing Sheets

Microfiche Appendix Included
(64 Microfiche, 1 Pages)

MAGNETIC RESONANCE ANGIOGRAPHY BY SEQUENTIAL MULTIPLE THIN SLAB THREE DIMENSIONAL ACQUISITION

MICROFICHE APPENDIX

Reference is made to Microfiche Appendix A, filed herewith, as required by 37 CFR 1.77(c)2. The Microfiche Appendix is on one microfiche sheet and consists of 63 frames of text.

BACKGROUND OF THE INVENTION

The present invention relates to nuclear magnetic resonance (MR) imaging and more particularly to a novel method of three-dimensional MR magnitude contrast or "time-of-flight" angiographic imaging acquisition of several overlapping thin slabs.

Non-invasive MR imaging techniques can be utilized to detect flowing fluids, such as blood in the human body. Techniques such as MR angiography provide a selective means of fluid flow detection in blood vessels. The bifurcations of the carotid arteries present one area of the human body in which blood flow information is crucial for diagnostic use. The methods described in this specification can be applied equally well to other areas and to subjects other than the human body. The bifurcations of the carotid arteries are frequent sites of atheromatous plaque formation, which is itself a precursor of transient ischemic attack and stroke. It is therefore highly desirable to be able to image atherosclerotic plaque before ulcerization which may result in a brain embolism. The presence of smooth atherosclerotic plaque can cause hemodynamically significant stenosis. The presence of the plaque may be evaluated with a standard, invasive, X-ray dye angiographic technique which requires injection of a contrast dye, via a catheter. This method is not totally benign. It is therefore highly desirable to use a non-invasive, magnetic resonance technique which provides a display in which only the arterial blood flow appears, while the stationary surrounding tissue is suppressed. It is also desirable to determine blood flow velocity and direction.

A nuclear magnetic signal from flowing blood can be obtained in one of two ways using existing MR techniques. The signal can be caused by a velocity dependent phase shift due to motion of the blood. This method is called phase contrast imaging. In the alternative, the signal can be caused by the relative increase in a nuclear magnetic signal magnitude due to the inflow of fresh, non-saturated, magnetization into the imaging region. Thus, this method is called magnitude contrast or "time-of-flight" imaging. Existing MR techniques have limited spacial resolution which is caused by an inherently low signal-to-noise ratio. Existing techniques also have flow effects which frequently cause artifactual loss of signal intensity. Thus, present MR time-of-flight, or magnitude contrast, imaging techniques can provide important flow information, but have disadvantages associated with the method of acquisition.

MR techniques can further be classified as either two-dimensional projection (similar to conventional X-ray angiography) or three-dimensional. Two dimensional projection imaging techniques, which directly acquire a projection through the subject are relatively fast, but generate only a single view of the areas of interest. Further acquisitions are necessary to obtain additional views. More significantly, all projection techniques are very sensitive to phase dispersion along the projection direction and there is generally significant signal loss due to this phase dispersion.

It is possible to combine many two dimensional images to make a multiple thin slice image. Multiple thin slice (two-dimensional) magnitude contrast techniques of this type obtain reasonable images of large and small vessels. However, the images are very noisy because of the small number of signal measurements which are used to generate the image relative to the number of signal measurements used in 3D imaging. There is also signal loss from velocity dependent phase dispersion due to the large slice thickness. In two dimensional magnitude contrast imaging, the slice thickness is typically not less than 2 mm. There is a trade off between slice thickness and echo time, $T_E$ (time from the center of the central lobe of a radio frequency (RF) pulse to the center of the received echo) and signal is lost due to either long echo time or large slice thickness. Each three dimensional volume, for which a single measure of the MR signal is obtained for display as part of the image, is called a voxel. Averaging the MR signal over an elongated voxel dimension, such as a 2-3 mm slice thickness, in which the fluid motion is not uniform, causes a velocity dependent loss in signal. This signal loss is due to phase dispersion. Signal loss therefore will occur in voxels where the dimensions of the voxel contain the edges of a vessel or a curved vessel segment where large spatially dependent variations in velocity occur. Therefore, it is advantageous to use a small voxel volume in order to obtain a good, usable signal from the inflowing blood.

Direct three-dimensional acquisition magnitude contrast techniques have the disadvantage of low blood signal due to the thickness of the three dimensional slab imaged. Due to the thickness of the slab imaged, blood remains in the slab for a significant fraction of the imaging time. Blood that remains in the slab is saturated by a RF pulse used in MR imaging. The saturation of the blood causes its signal to be weaker than the signal from fresh inflowing blood. This decrease in signal is especially true for small vessels with slow blood flow. The loss in vessel detail due to the time blood spends in the slab, as well as due to phase dispersion across the voxel dimensions, is reduced with the use of thinner slabs and thus fewer and/or smaller voxels in the acquisition. However, this decreased slab thickness results in a thinner field of view which limits the diagnostic utility of the technique.

BRIEF SUMMARY OF THE INVENTION

An object of this invention is to combine the advantages of the two-dimensional MR techniques (thin excitation volume which results in minimal signal loss due to RF saturation) with the advantages of the three-dimensional MR techniques (lower image noise and smaller voxel dimensions) and eliminate the disadvantages of both techniques. This invention relates to a multiple thin slab volume image acquisition technique which combines the noise reduction of three dimensional ("3D") acquisition with the reduced signal saturation loss of multiple thin slice techniques ("2D"). The inventive technique uses a thin slab comprised of a multiple of thinner slices and a short echo time (a quick readout of the signal) to further reduce the sensitivity of the technique to phase dispersion.

The inventive technique consists of acquiring MR signals from multiple overlapping regions (thin slabs) by the use of both a first magnetic gradient waveform applied in logical x, y and z axes and a RF magnetic field waveform (applied as a short pulse). In total, the MR signals constitute MR signal data. The inventive technique may also interleave the acquisition of signals from nonadjacent slabs, within the area to be imaged in order to increase effective repetition time. By acquiring readings from nonadjacent slabs, the time between RF pulses can be reduced. Image data is obtained from a reconstruction algorithm which performs a 3D Fourier Transform of the MR signal data. Reconstruction algorithms are known in the prior art and are not claimed as part of this invention. By use of the inventive technique, adjacent slabs are overlapped, allowing the removal of edge images from each slab where signal losses due to each slab's excitation profile occur. The removal of edge images also removes edge images where "wrap-around" artifacts occurs due to a mathematical replication of the MR signal. The MR signal data from the central group of slices from each slab, which have yielded good signal, is then merged together and combined into one contiguous set of image data covering the 3D region of interest within the subject. The resulting image data may then be fed into a standard MR display algorithm capable of producing images for diagnostic purposes. Display algorithms are known in the prior art and are not claimed as a part of this invention.

DETAILED DESCRIPTION OF THE PREFERRED EMBODIMENT

Figure 1:
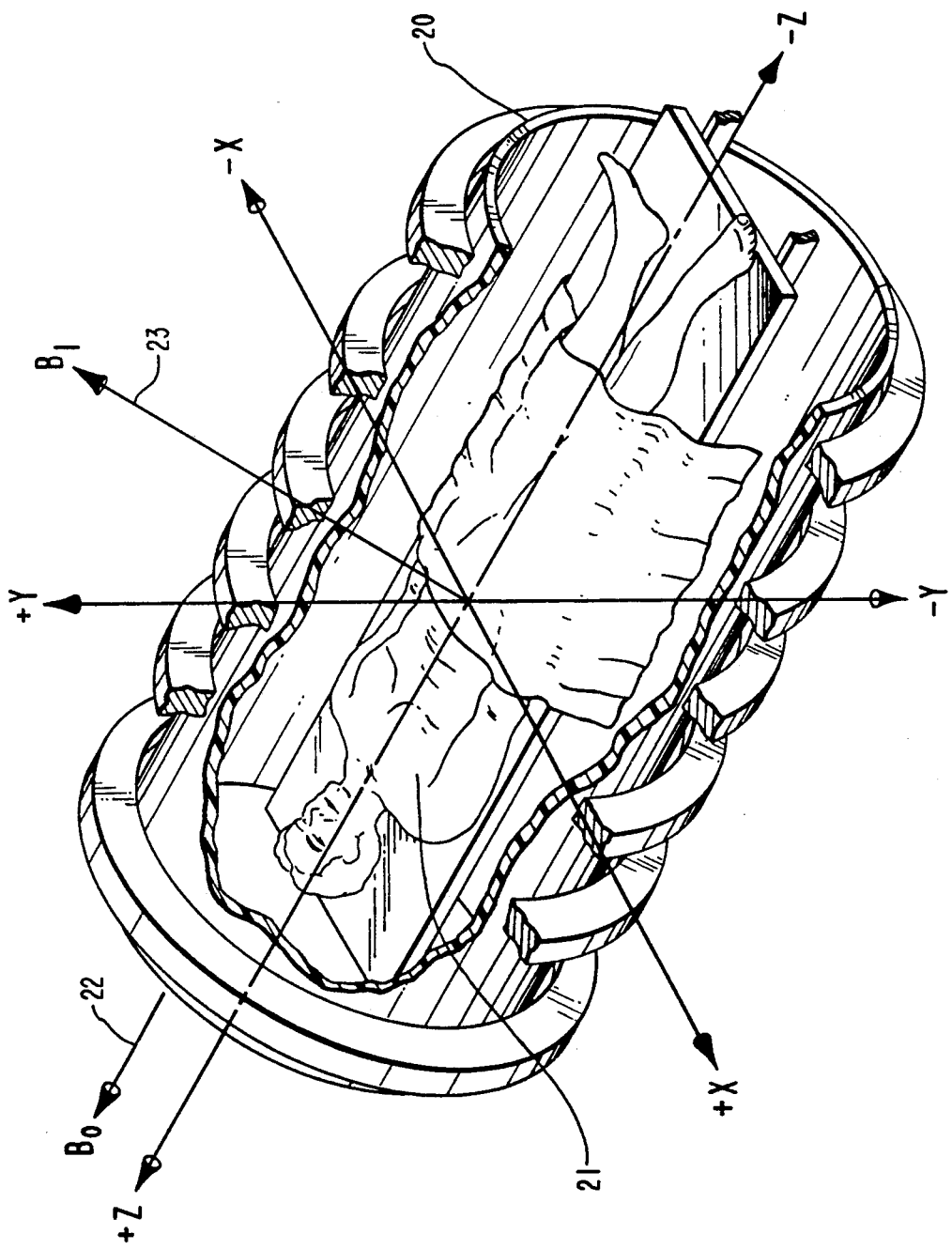
FIG. 1 illustrates a typical arrangement of a MR apparatus depicting a static main magnetic field, $B_0$. Also shown is a RF field, $B_1$.

Referring to FIG. 1, a subject 21 to be imaged is situated in a MR apparatus 20 such as a 1.5 Tesla GE Signa MR scanner where a substantially homogeneous, static magnetic field $B_0$ 22 is directed along the z axis of a Cartesian coordinate system. For convenience, two separate cartesian coordinate systems are defined. A "physical coordinate system" is fixed in space relative to said MR apparatus. A "logical coordinate system" is not fixed in relation to space and is dependent on the imaging geometry. A physical z axis, in said physical coordinate system, is directed along the bore (cylindrical axis) of said MR apparatus in the direction of the static magnetic field $B_0$ 22. For example, if a human patient is being imaged, the physical z axis aligns with the direction of the patient's feet to head. A physical x direction is usually defined as horizontal and perpendicular to the z direction. A physical y direction is usually vertical and perpendicular to both the physical x and z directions. In the logical coordinate system, a logical z axis is defined as the principle direction of fluid flow. In the preferred embodiment, the logical z axis is the direction of the small, thin slab dimension. The logical x and y directions are perpendicular to each other and to the logical z direction. A logical x direction is usually chosen along a wider dimension of the subject or object being scanned. A logical y axis is selected to be the remaining dimension. In a typical case where the subject is lying down, the physical z axis in said MR apparatus and the logical z axis share the same direction. In the typical case, the z axis runs along the length of a subject's body in the MR apparatus.

Figure 2:
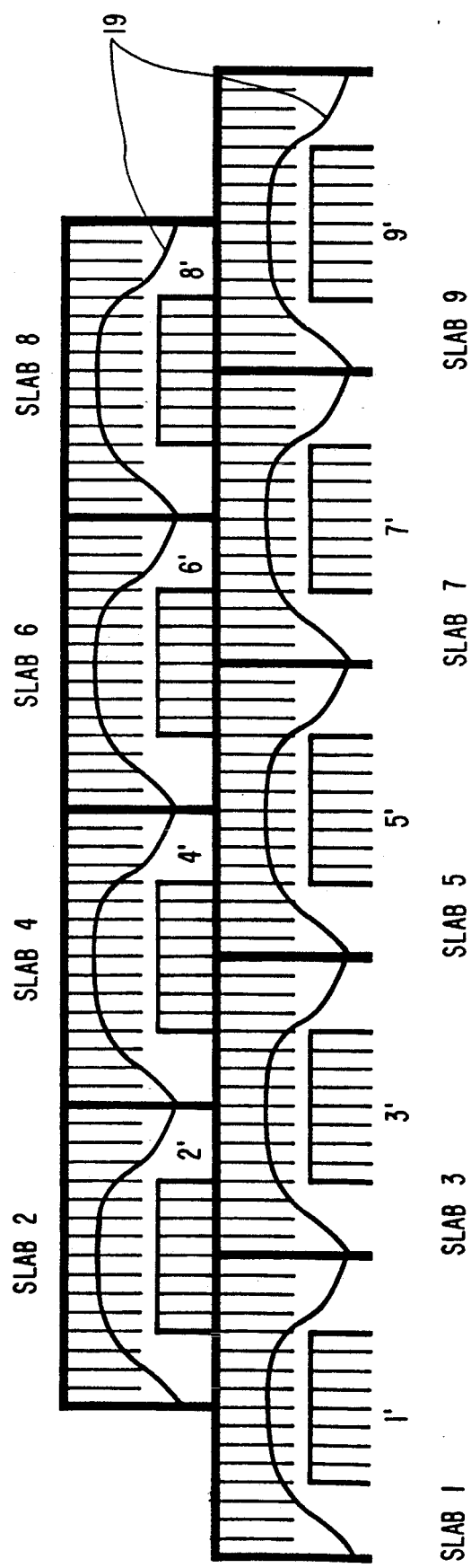
FIG. 2 illustrates multiple overlapping thin slabs (and multiple thinner slices within each slab) over which MR imaging is to be acquired for an area of interest in a subject. Also shown is a slab excitation profile.

A final image data set must be reconstructed from multiple MR signals obtained from a sample in said subject 21 by a receiving coil or coils in said MR apparatus, not shown. Said final image data set, in the preferred embodiment, consists of multiple MR signal measurements obtained from multiple, overlapping slabs (within said sample) each comprised of a multiple of thinner slices. The thickness of a slab is arbitrary and can be chosen by the operator. Typical slab thicknesses are 15 mm and 30 mm. The number of thin slices within each slab is an arbitrary multiple of two. Typically, values of 16, 32, 64 or 128 slices may be used. The preferred embodiment uses sixteen slices and a slab thickness of 15 mm. FIG. 2 depicts an image area of nine slabs, 1 through 9, where each slab consists of 16 slices. Said MR signal obtained from outer slices, (slices near the edge of a slab) are not typically used in the final image data set due to reduced magnetization signal and artifact experienced at outer edges of a slab. Reduced magnetization at outer edges of said slab is caused by a slab excitation profile 19. A RF frequency (RF) pulse is used in MR imaging techniques to cause a precessing magnetization in said slab. When a RF pulse is applied to said slab, the effect of said RF pulse, at outer edges of said slab, is not as strong as in a center portion of said slab. Therefore, the MR signal is disregarded in the final image data set for the areas where strong signal is not received.

Each of said thin slices is comprised of a plurality of three dimensional picture elements. In the preferred embodiment, each slice is comprised of 65,536 picture elements or voxels, (256 in the logical x direction by 256 in the logical y direction). The number of said picture elements can be increased to improve the clarity of said final image or reduced to decrease imaging time. In one example, a field of view in said subject is chosen to be 240 mm in the x direction by 240 mm in the y direction by 67.5 mm in the z direction. Said field of view can be smaller or larger depending upon said subject or the area of a subject to be imaged (i.e. in imaging an ankle or wrist the area to be imaged could be smaller than when imaging a subject's head). In the preferred embodiment, said picture elements are cubes of linear dimension 0.9375 mm on each side, (i.e. 240 mm/256 elements).

Once the desired image area is selected, the orthogonal directions of said image area are equated with directions in a standard rectilinear coordinate system. The short dimension, the direction in which blood normally flows, (67.5 mm) is defined as the logical 'z' direction. For the remaining two directions, the logical 'x' direction is assigned to the wider dimension of said subject, (e.g. from shoulder to shoulder). The logical 'y' direction is assigned to the remaining body dimension (e.g. from back to front of the body). In the preferred embodiment, the center of said image area is selected to be the same as the half way or mid point of the center slab of the multiple thin slabs. In FIG. 2, the center of said image area would be in the middle of slab 5. Remaining slabs in the image area are positioned on either side of the center slab.

Referring to the slabs 1 through 9 shown in FIG. 2, an example of nine overlapping slabs is shown. The image area can consist of any number of thin slabs. Each slab is comprised of sixteen thinner slices in the example. The center of said image area corresponds to the center of slab 5. Odd numbered slabs 1, 3, 5, 7 and 9 are situated adjacently. Even numbered slabs 2, 4, 6 and 8 overlap said odd numbered slabs. For example, the first eight slices of slab 2 overlap the last eight slices of slab 1. The last eight slices of slab 2 overlap the first eight slices of slab 3, as shown. For ease in depicting overlapping slabs, said even numbered slabs in FIG. 2 are shown above said odd numbered slabs. In reality, however, each even numbered slab is situated within the sample image area and overlaps the odd numbered slab on either side.

An example of said slab excitation profile 19 caused by said RF pulse is illustrated within each slab. As described above, the effect of said RF pulse is reduced at the edge of said slab. Said slab excitation profile illustrates the effect of said RF pulse over a slab width. Often the strongest MR signal will be received from center slices within a slab. (However, some shift in strong signal may occur where strong MR signal is offset toward one end or the other of a slab). For this reason, the center portion of each slab is usually used to prepare said final image data set. The center portion of said slabs are shown in FIG. 2 as 1' through 9'. As can be seen, said final data image set, constructed of contiguous center portions of said slabs, covers the imaged area without interruption.

Typically, imaging of a selected area is performed in such a manner that measurements of MR signals from one entire slab are obtained first. After all the measurements of said first slab image are complete, the measurements for a second entire slab are taken and so forth. As a way of reducing the imaging time, said second slab to be imaged can be selected at a distance from said first slab imaged and the RF pulses and corresponding measurements for both slabs can be alternated between slabs. The "alternating" measurements are taken during a time when no signal measurements could be made in a first slab. Therefore, the measurements made in these time periods make use of this "dead time" and shorten the imaging time. The measurements are alternated between slabs at a distance from each other. Poor signal data alternating is received from measurements taken from adjacent slabs. The imaging procedure is set forth below.

When exposed to a strong, static, magnetic field, 22 parallel to the z direction, as shown in FIG. 1, randomly oriented protons in said subject 21 align with said strong, static magnetic field. Said static magnetic field is applied along the length (i.e. z direction) of said subject by use of an electric current in a coil or coils in said MR apparatus 20. In order to select a slab thickness to be imaged, a gradient magnetic field is applied by a separate coil or coils in said MR apparatus along the logical z axis as shown in FIG. 1-C.

A small radio frequency magnetic field 23 oscillating at the Larmor Frequency, corresponding to the total static magnetic field 22 at the location of said slab, is applied in the plane orthogonal to the physical z axis. The effect of said radio frequency magnetic field is localized to said slab due to a magnetic field perturbation caused by said magnetic field gradient in the logical z direction. The strength of the net magnetic field at the location of said slab determines the frequency required to tip nuclear spins in a sample and cause the precessing magnetization. In the preferred embodiment the nuclear spins are those of protons in the material or sample. The frequency required to tip nuclear spins is the Larmor Frequency. The relationship of the Larmor Frequency to the strength of said magnetic field is given by the equation:

$$f = \gamma B_0 / 2\pi$$

where f is the frequency in Hertz; $\gamma$ is the gyromagnetic ratio, which is a constant.

Transverse magnetization in said slab is thus created by applying said RF magnetic field 23 called $B_1$, in a manner such that said RF field rotates synchronously with the precessing nuclear magnetization.

The introduction of said radio frequency at the Larmor Frequency causes said aligned nuclear magnetization to tip relative to the physical z axis into the physical x-y plane. Said tip in the aligned nuclear magnetization is due to a torque caused by the introduction of said RF magnetic field at the Larmor Frequency, which has been introduced at a right angle to the physical z axis. Said torque causes a rotation of said nuclear magnetization about said RF magnetic field 23 into the physical x-y plane. Once rotated away from the physical z axis, said nuclear magnetization precesses about the physical z axis at the Larmor Frequency. The combined precession of magnetization in the physical x-y plane creates a macroscopic magnetic moment that is responsible for the induction of an electric signal. The signal is detected as a voltage in a receiver coil or coils in said MR apparatus 20.

Figure 1A:
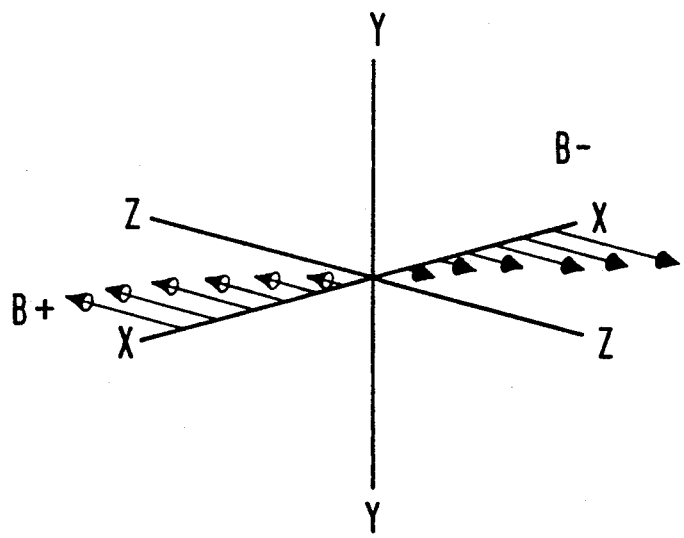
FIGS. 1A, 1B, and 1C depict the gradient magnetic fields generated in a MR apparatus in the logical x, y and z directions respectively.
Figure 1B:
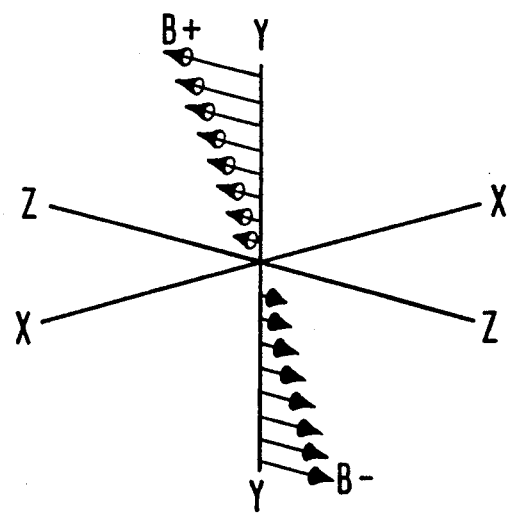
Figure 1C:
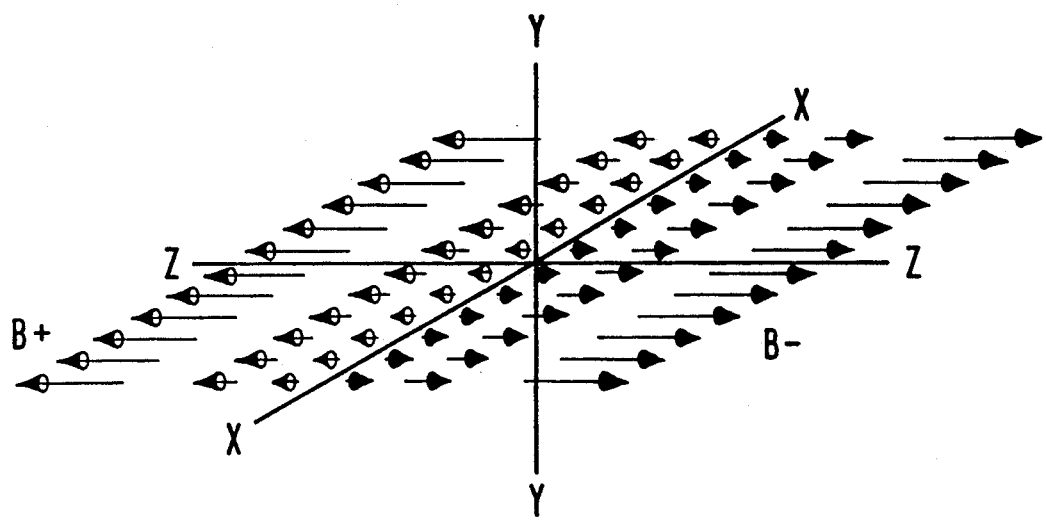
Figure 3:
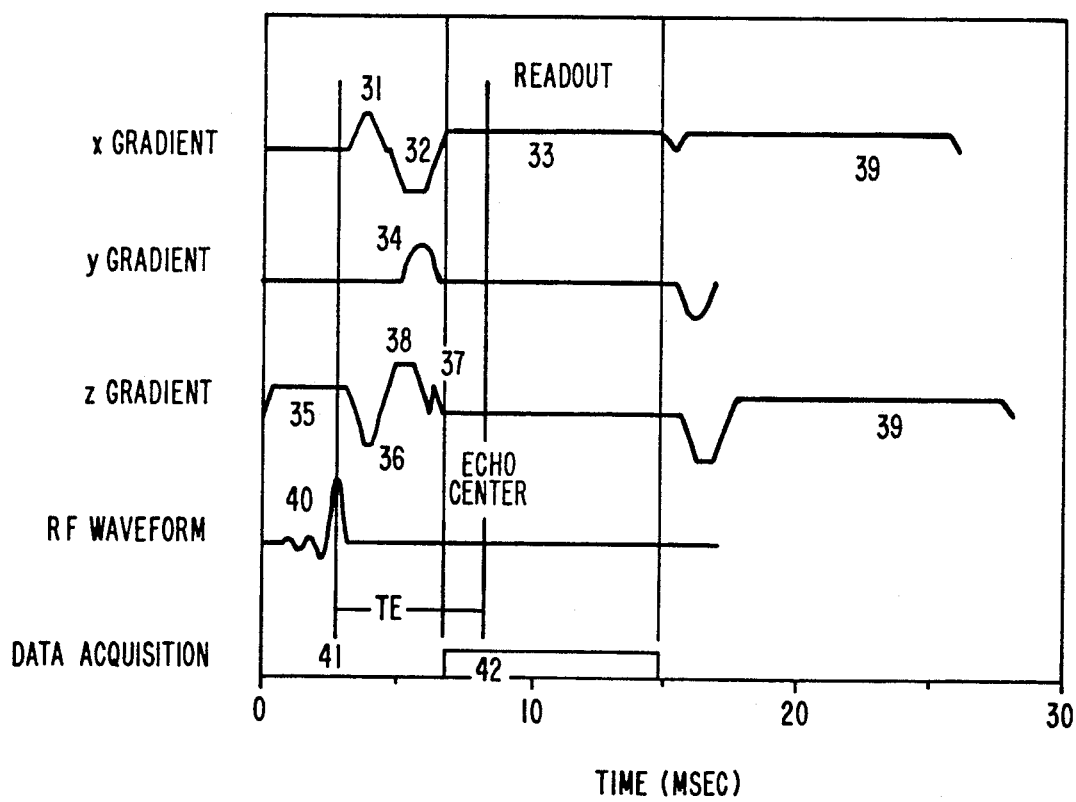
FIG. 3 illustrates an example of a multislab magnetic gradient waveform used during one radio frequency pulse.

The imaging process is made possible by variations of the magnetic field gradients within the imaging area. A field gradient in the logical x direction is shown in FIG. 1A and a field gradient in the logical y direction is shown in FIG. 1B. Measurements in the imaging process depend upon variations of a specific sequence of said magnetic field gradients (in the logical x, y and z directions) and said RF waveforms applied as a pulse (at the Larmor Frequency for each slab) and introduced at a right angle to the physical z axis. A representative gradient waveform example and radio frequency pulse are shown in FIG. 3. Said magnetic field gradients, as shown in FIG. 3, cause time-dependent control of spatial variations in the static, main, magnetic field 22 in the x, y and z directions. Said RF pulses generate a synchronously, rotating magnetic field that is oriented orthogonally to said static, main, magnetic field. The application of said sequence of magnetic field gradients and RF pulse is controlled by a computer program. A copy of the source code of said computer program is attached hereto as Microfiche Appendix A. Microfiche Appendix A is incorporated herein by reference and is part of this specification and description of the invention.

The intensity of a MR signal obtained in said receiver coil or coils in said MR apparatus 20 is a function of the angle to which said magnetization is tipped into the x-y plane by said RF pulse. The angle of the tip is proportional to both the amplitude and duration of said RF pulse. Since pulse duration is optimally kept to a minimum, in order to decrease MR signal loss before MR signal readout, the amplitude of said RF pulse is increased to correspondingly increase the tip angle $\alpha$. The signal from any given excitation pulse of tip angle $\alpha$ is proportional to transverse magnetization $M^-$, which can be written:

$$M^- = M_z(0^-) \sin\alpha \, e^{-TE/T_2}$$

where $M^-$ is the magnitude of transverse magnetization at the time of measurement, $T_E$; $T_2$ is the transverse magnetization relaxation time; $\alpha$ is the tip angle; and $M_z(0^-)$ is the z component of said magnetization (along the static field direction) just before an RF excitation pulse is applied. For example, when blood enters a region of interest, a pre-pulse magnetization, $M_z(0^-)$, is equal to an equilibrium value of magnetization, $M_0$. For subsequent excitation pulses it is necessary to determine $M_z(0^-)$ from Bloch's equations. Solving Bloch's equations for the z component of magnetization after one excitation of tip angle $\alpha$ gives:

$$M_z(t) = M_0[1 - (1 - \cos\alpha)e^{-t/T_1}]$$

The signal of blood after N pulses of tip angle $\alpha$ can be expressed:

$$M_N^- = A + B\epsilon^N$$

where
$E = e^{-TR/T_1}$
$\epsilon = E\cos\alpha$ $$A = \frac{1-E}{1-E\cos\alpha} M_0 e^{-TE/T_2} \sin\alpha$$

$$B = \frac{E - E\cos\alpha}{1 - E\cos\alpha} M_0 e^{-TE/T_2} \sin\alpha$$

$T_R$ = Repetition time between each subsequent RF pulse and
$T_1$ = longitudinal relaxation time A 90° tip angle will result in minimal blood contrast signal or a signal equivalent to that of stationary tissue after the first pulse. Any tip angle significantly greater than 0° and significantly less than 90° can provide some blood contrast signal. An optimum tip angle of 30° is used in the preferred embodiment but comparable results have been found using tip angles of 30°–40°.

One example of the magnetic gradients and RF pulse is shown in FIG. 3. Measurements of said MR signal in a slab are taken while a gradient is applied in the x direction. Thus, the x direction is the "readout" direction. Magnetic gradients are applied in the x direction to provide for a spatially encoded MR signal. The magnetic gradient in the x direction is comprised of lobes 31, 32 and a readout gradient 33 which represent levels of magnetic gradient in the x direction. Said lobes 31 and 32 precede actual MR signal readout. Readout occurs during a readout period, while said readout gradient 33 is applied. Lobes 31 and 32 in said gradients in the x direction serve to provide a null zeroth and first moments of said "readout" gradient waveform 33. Both the zeroth and first gradient moments must be zero simultaneously at the time of the echo center 42 in order to obtain a strong MR signal from flowing fluid. A nonzero gradient moment would result in a weak and possibly unusable MR signal due to randomness of the precessing spins in the x-y plane. Said spins would cancel each other out rather than provide a magnetic moment which could be "read" by said receiver coil or coils in said MR apparatus 20.

Echo signal measurements are obtained during the application of said readout. Application of said x direction readout magnetic gradient spatially encodes the MR signal from the slab in the x direction. Since said MR signal must later be reconstructed to signal image data by use of a Fourier Transform in a reconstruction algorithm, the encoding from the readout gradient is necessary to place said MR signal properly in the x direction. Readout of said MR signal in the x direction is obtained over said readout period for each of a multitude of pulse sequences. In the preferred embodiment, said readout period begins at 4.0 milliseconds after a Time Zero 41, (Time Zero is the center of the main lobe of each RF pulse waveform) and runs until approximately 12 milliseconds after Time Zero. An echo center 42 of said readout period occurs where the summation of magnetic moments in the x axis is 0. The strongest signal is received at this point in time. Summation of said magnetic moment is zero at a time where the area under lobes 31, 32, and said readout gradient 33 equal zero.

A spatial phase encoding y magnetic gradient 34, in the imaging area encodes the image area in the logical y direction. Encoding a MR signal received by said MR apparatus in the y direction allows a Fourier Transform in said reconstruction algorithm to image properly said MR signal in the y direction. Said y direction gradient is stepped through a multitude of amplitude values during each imaging sequence to cover all values of y selected by the operator. In the preferred embodiment, each slab has 256 voxels in the y direction. Said y gradient is stepped through each of the 256 amplitude values to encode the slab for imaging.

A magnetic gradient in the logical z direction 35, is used to select a slab to be imaged. In the presence of said z magnetic field gradient, the net static magnetic field, which is the sum of the initial magnetic field, $B_0$, and the spatially variant gradient magnetic field, changes as a function of position in the logical z direction. The Larmor Frequency is proportional to said net static magnetic field and also changes as a function of position in the logical z direction. Said slab to be imaged is selected by applying a magnetic gradient in the logical z direction and applying a RF magnetic field waveform. The RF magnetic field waveform is made up of a continuum of frequencies that are equal to the continuum of Larmor Frequencies within said slab.

Slab selection magnetic gradients 36 and 37 in the logical z direction serve to null the zeroth and first moments of said slab selection magnetic gradient, 35. As in the x gradient, the summation of gradient moments for gradients 35, 36 and 37 must be zero in order to obtain signals from flowing blood.

A slice phase encoding waveform 38, is applied in the logical z direction to provide spatial phase encoding for said slices within said slab to be imaged. Said slice phase encoding gradient 38 is stepped through several amplitude values during the imaging sequence to complete each of the imaging processes for an entire slab. In the case of a slab of sixteen slices, said slice phase encoding gradient 38 will be stepped through sixteen amplitudes.

A randomizing waveform 39, is used to reduce any signal at the conclusion of said imaging sequence. Said randomizing waveform 39 acts to spoil said MR signal before a next imaging pulse is received. Said randomizing waveform may be applied in any of the logical coordinate directions.

A RF pulse waveform 40, is used to prepare magnetization within a selected slab to give a signal for imaging.

As described above, said magnetization caused by said precessing magnetization in the x-y plane is related to said RF pulse used to tip said magnetization into the x-y plane. An effective frequency band of said RF pulse is chosen to correspond to said slab's location and width within a sample. In order to increase the strength of said MR signal obtained, said RF pulse waveform is stopped at the first zero (Time Zero 41) after a main central lobe. Truncation of said RF pulse at this point (rather than allowing the waveform to completely play out in a symmetrical form) allows for an earlier reading of said MR signal. Early reading of said MR signal results in a stronger signal being received by said receiving coil or coils in said MR apparatus.

In the preferred embodiment, the imaging process for the sixteen images (slices) of the first slab require that the sequence (an example of which is shown in FIG. 3) be repeated 4096 times (16 slices in the logical z direction x 256 values in the logical y direction). Readouts are taken along the entire x direction (256 values) of the slab for each RF pulse. Each repetition of the sequence is performed with a unique combination of values of the y magnetic gradient waveform 34 and the z magnetic gradient waveform 38. An area under the lobe of the z magnetic gradient waveform 38, (denoted $A_z$) has one of sixteen values given by:

$$A_z = \frac{j - (N_z + 1)/2}{(\gamma)FOV_z}$$

where j is the index that takes on the integer values between 1 and $N_z$, where $N_z$ is the number of images in the section (e.g. sixteen slices per slab in the preferred embodiment); and $FOV_z$ is the total thickness of the $N_z$ slices: $FOV_z = N_z \times w_z$, where $w_z$ is the thickness of (and spacing between) each slice.

An area under the y magnetic gradient waveform 34, (denoted $A_y$) has one of 256 values given by an expression similar to the equation above.

$$A_y = \frac{k - (N_y + 1)/2}{(\gamma)FOV_y}$$

where k is an index that takes on the integer values between 1 and $N_y$, where $N_y$ is the number of picture elements in the logical 'y' direction (e.g. 256 in the preferred embodiment) and $FOV_y$ is the dimension (in centimeters) of the image area in the logical y direction, (e.g. $FOV_y = N_y \times w_y$); where $w_y$ is the width (and spacing between) each picture element in the logical y direction. The units in the above area equations are Gauss-seconds per centimeter and can be computed and specified on any MR apparatus. For ease in describing the inventive technique, arbitrary directions for x, y and z have been chosen and used throughout this specification and the drawings. However, it is within the scope of the inventive technique that the rectilinear coordinate system may be rotated and the magnetic gradient waveforms adjusted to be oriented in any arbitrary configuration. Referring now to FIG. 2, in order for an image to be acquired from thin, overlapping slabs, difficulties in MR imaging must be overcome. First, the center portion of an area to be imaged in said MR apparatus will not always align exactly with an arbitrary "zero" position in the MR apparatus. The "zero" position in said MR apparatus is set by the internal hardware of said MR apparatus. It is well known, and can be demonstrated mathematically, that a generation of image data from MR signals in a sample causes an infinite number of copies of said image data to be replicated in the "z" direction with a spacing equal to a chosen field of view in the z direction. A reconstruction algorithm will reconstruct image data occurring between set boundaries given by a field of view in the z direction centered at said "zero" position of said MR apparatus. Thus, if image data extends beyond the boundaries of a reconstructed field of view, the replication of said image data will cause said image data to reappear at the other end of said reconstructed field of view. This quality of MR imaging is due to a Fourier Transform in a reconstruction algorithm and is often referred to as "spatial aliasing" or "wraparound". If a region imaged is shifted by exactly one field of view distance from the central field of view, a reconstruction algorithm will reconstruct an exact replica of said image data that occurs in said central field of view.

If a region imaged is shifted by some fraction of a field of view width from the central field of view, it is necessary to perform an operation which shifts the image data back to the center of a field of view. Said shift is accomplished by multiplying measurement data by a complex number that has a magnitude of one and a phase that is a product of a phase encoding index, k, and a constant that is $2\pi$ times said fractional field of view shift. This multiplication is accomplished by making the phase angle of said RF pulse equal to the desired phase angle. That is, the RF pulse can be considered to be a magnetic vector in the physical x-y plane that rotates at a desired frequency. The phase angle of the RF pulse is the angle or direction of the RF magnetic vector in the x-y plane at a specific time (e.g. t=0) from the start of the RF pulse. To change the phase angle of the RF magnetic vector requires that the direction of the magnetic vector at that instant in time be rotated by the desired phase angle. By way of example, if the offset of a center of a slab (to align properly an image within a field of view,) is one tenth of a slab width, the phase angle of said RF pulse is rotated 36° (360° × 1/10).

In the preferred embodiment, said overlapping slabs are purposely shifted one-half of a slab width from the previous slab and continued in this overlapping fashion over the entire imaged area. However, slabs can be shifted or overlapped any amount. To carry out this shift of one half slab width (i.e., the overlapping of slabs), the phase angle of said RF pulse must be rotated 180° (360° × ½) for each subsequent index, k, of said z phase encoding for all even numbered slabs in FIG. 2. The even numbered slabs are the slabs for which the replicated image data is offset by one half slab width from a slab centered in said MR apparatus. Stated another way, a shift of one half slab width corresponds to a phase angle rotation of one half of 360° for each subsequent z phase encoding.

A reconstruction algorithm also adjusts to compensate for an artifact due to a DC or slowly changing error signal that is independent of said MR signal. Because this error signal is slowly varying, an artifact that results occurs in the center of an imaged slab. By multiplying said MR signal for each z phase encoding by either +1 or −1, that is $(-1)^k$ where k is said z phase encoding index, said artifact is shifted to the edge of said images. This product would also cause a shift in said image data unless the phase of said RF pulse is also rotated by additional 180° for each subsequent z phase encoding.

Because of the two types of phase rotation of the RF pulse (first, to compensate for wraparound problems in the overlapping slabs and second, to compensate for the moving of said artifact to the edge of the slab image) the total phase rotation increment for slabs that are centered on the central field of view (i.e. slabs 1, 3, 5, 7 and 9 in FIG. 2) is 180° in the preferred embodiment. The phase rotation of said RF pulse for slabs that are shifted by ½ of the field of view (the even slabs of FIG. 2) is 180° (to compensate for wraparound)+180° (to shift said artifact to the edge of said images)=360° of rotation. This total rotation of 360° is equivalent to no rotation at all (i.e. 0°=360°). In FIG. 2, the slices in the odd numbered slabs have a coefficient of said RF pulse that alternates between 1 and −1. (0°, 180°) For the even numbered slabs the coefficient of said RF pulse does not alternate due to the additional 180° phase rotation of the RF pulse required to shift the overlapping slab. (0°, 360° etc). Stated another way, a phase rotation of 180° for the shift of said overlapping slab added to the alternating phase rotation of 180° to move the artifact to the edge of the slab image, results in a coefficient of +1 for each said RF pulse (i.e., $1 \times 1 = +1$; and $(-1) \times (-1) = +1$; etc.).

When a group of slabs are all shifted by a small fraction of the field of view, (to center the subject to the "zero" position said MR apparatus for instance) a phase rotation to compensate for this shift must be added to the fundamental rotation for all slabs. Thus, for example, if the slabs are offset by 1/72 of the field of view width, to center the subject in the MR apparatus, the phase of said RF pulse must be rotated 5° (360°× 1/72). Therefore, a sequence of RF pulses as a function of the z phase encoding index, k, would be:

| index | odd slabs | even slabs |
|---|---|---|
| 0 | 0° | 0° |
| 1 | 185° | 5° |
| 2 | 10° | 10° |
| 3 | 195° | 15° |
| 4 | 20° | 20° |
| . | . | . |
| . | . | . |
| etc. | | |

It must be noted that the shift of said overlapping slabs need not always be one-half slab width. The inventive technique provides for an arbitrary slab shift in the manner described below.

To simplify the analysis of an arbitrary shift in slab overlap, only the imaging equation in the z direction is considered. Imaging in the x and y direction is performed using standard MR imaging techniques known by those skilled in the relevant art. By tailoring said RF pulse, a profile Wj(z) and the relative phase $c_e(k,j)$ of the transverse component of the magnetization of the excited slab can be chosen. For slab j, the kth phase encoded received signal is:

$$s_{k,j} = \int c_e(k,j) \, W_j(z) m(z) \, e^{2\pi i \gamma'(zk\Delta A z)} \, dz + s_n$$

where $s_n$ is said slowly varying error (noise) signal and $A_z$ is said incremental area under said z phase encoding gradient. The value of $A_z$ is determined by the desired slice thickness $w_z$ and the argument required by the definition of a discrete Fourier Transform:

$$\gamma' w_z A_z = \frac{1}{N_z}$$

For each slab, the reconstructed magnetization, m', is obtained as the inverse Fourier Transform of $s_{j,k}$ for k slices. The magnetization for slice k' of the jth slab is given by $$m'(D_j + k'w_z) = \sum_{k=-(N_z-1)/2}^{(N_z-1)/2} (-1)^k s_{k,j} e^{-2\pi i \frac{kk'}{N_z}} \Delta f_z$$

Where $D_j$ is the location of the center of the jth slab. The reconstructed image, m, consists of a signal term (due to the magnetization in the object m(z)), and an error term due to $S_n$. The coefficient $(-1)^k$ is used with said RF pulse as described above to move said artifact, due to $s_n$ to the edge of the reconstructed slab in the image. When $s_n$ remains constant the error term due to $s_n$ becomes:

$$\frac{1}{Z} \sum_{k=-(N_z-1)/2}^{(N_z-1)/2} (-1)^k s_n e^{-2\pi i \frac{kk'}{N_z}} =$$

$$\frac{1}{Z} s_n \frac{\sin\left[\pi\left(k' + \frac{N_z}{2}\right)\right]}{\sin\left[\frac{\pi}{N_z}\left(k' + \frac{N_z}{2}\right)\right]} = \frac{1}{w_z} s_n \delta_{k' \pm N_z/2}$$

which, for images reconstructed, is only significantly different from zero for $k' = +/-N_z/2$ (i.e. at the edge images). Thus, an image term can be written:

$$m'(D_j + k'w_z) = \frac{1}{Z} \int W_j(z) m(z) \sum_{k=-(N_z-1)/2}^{(N_z-1)/2} (-1)^k c_e(k,j) e^{2\pi i \frac{k}{N_z}[\frac{z}{w_z} - k']} dz$$

To simplify this equation, the function of said RF excitation can be written:

$$c_e(k,j) = (-1)^k e^{\pi i k \phi_j}$$

Where $(-1)^k$ compensates for the $(-1)^k$ in the reconstruction algorithm and where $\phi_j$ is the phase movement for the jth slab. Substituting provides:

$$m'(D_j + k'w_z) =$$

$$\frac{1}{Z} \int W_j(z) m(z) \frac{\sin\left(\frac{\pi N_z}{Z}[z - k'w_z + \phi_j Z/2]\right)}{\sin\left(\frac{\pi}{Z}[z - k'w_z + \phi_j Z/2]\right)} dz$$

The trigonometric ratio in the above equation is periodic (with period Z) and is nearly equal to the trigonometric identity sin(x)/x for small values of x. To the extent that m(z) is relatively constant over a central region of a slab where the ratio is largest, the ratio, above, can be approximated as a string of delta functions:

$$\frac{1}{Z} \frac{\sin\left(\frac{\pi N_z}{Z}[z - k'w_z + \phi_j Z/2]\right)}{\sin\left(\frac{\pi}{Z}[z - k'w_z + \phi_j Z/2]\right)} =$$

$$\sum_j \delta\left(z - k'w_z + \frac{\phi_j Z}{2} - jZ\right)$$

In order to reconstruct the image at a proper location in the z direction, it is necessary that at least one term of the summation be zero (for some slab value j') when $z = D_j + k'w_z$; where $D_j$ is the position of the slab center for the jth slab and $k'w_z$ is the position of slice k' (of width and spacing $w_z$) within a slab. This argument can be expressed as $$D_j + k'w_z - k'w_z + \frac{\phi_j Z}{2} - jZ = 0$$

which can also be expressed as $\phi_j = -2D_j/z + 2j'$.

Images can thus be reconstructed with arbitrary slab center offset positions (e.g. $D_j$) by controlling the phase of the excitation pulse:

$$c_e(k,j) = (-1)^k e^{-2\pi i k D_j/Z} e^{2\pi i k j} = (-1)^k e^{-2\pi i k D_j/Z}$$

To avoid wraparound (i.e. contributions from other regions specified by different values of j', $W_j(Z)$ must be tailored not to excite magnetization outside of a region imaged ($D_j +/- Z/2$). This is accomplished by defining a window function:

$$W_j(z) = 1 \text{ for } D_j - fZ/2 < z < D_j + fZ/2$$

$W_j(z) = 0$ for all other values.
Because an excited profile of a slab is nonzero in a region slightly wider that the window function (i.e. spillover), the ratio of the width of the excited slab to the imaged slab width Z must be slightly less than one.

The temporal shape of said RF pulse used to obtain a nearly rectangular slab excitation profile is determined from the net static magnetic field within the boundaries of said slab to be excited. The net static magnetic field is the sum of the initial static magnetic field, Bo, and the spatially variant gradient magnetic field in the logical z direction. The temporal shape of said RF pulse is approximately the shape that provides a uniform frequency distribution that is equal to the Larmor frequency distribution within said slab to be excited. The amplitude of said RF pulse can be increased or decreased to increase or decrease the tip angle of magnetization within said slab. An arbitrary phase (direction in the x-y plane) for each excitation can be chosen and thereby vary the net direction of the transverse magnetization (in the x-y plane). Said RF excitation pulse used for the kth phase encoding of the jth slab selection can be represented:

$$B_1(t) = \frac{c_e(k,j)}{fZ} \int_{D_j - fZ/2}^{D_j + fZ/2} e^{2\pi i \gamma' z G_z t} dz =$$

$$c_e(k,j) e^{2\pi i \gamma' D_j G_z t} \text{sinc}(\gamma' fZ G_z t)$$

where sinc(x) is defined as $\sin(\pi x)/\pi x$; $\gamma'$ is $\gamma/2\pi$; and $G_z$ is said magnetic gradient waveform in the z direction applied during slab selection. A coefficient, $c_e(k,j)$ represents the complex phase of slab excitation.

A sequence of values for each slice encoding, k, the y encoding, and said RF pulse coefficient signs for the preferred embodiment are shown in Table 1.

After all said MR signals are received by said coil or coils in said MR apparatus, images from each slab are reconstructed using a standard 3D reconstruction algorithm. In the preferred embodiment, the reconstruction algorithm is one developed and used by General Electric. In this reconstruction algorithm for each x and y position in the measurement array, a one dimensional [z direction] Fourier Transform is performed over the 16 measurements in the direction of said 'z' phase encoding index. After this Fourier Transform is completed for all x, y positions, a 2D Fourier transform (for the x-y plane) is performed for each slice image. Said slice images are then added to a system image data base in the order representing the physical position within the subject.

Detail of the image in the sample is then reviewed using final images or by reprojecting values from said final images along straight lines through the sample using a standard display algorithm. Display algorithms are known to those skilled in the relevant art and are not part of this disclosure.

While the invention has been described with reference to specific predefined embodiments, the description is illustrative of the invention and is not to be considered as limiting the invention. Various modifications and applications may occur to those skilled in the relevant art without departing from the true spirit and scope of the invention as defined by the appended claims.

TABLE 1

| Slice (k) | y value | RF pulse coefficient Centered slab | Half Offset slab |
|---|---|---|---|
| 1 | 1 | 1 | 1 |
| 1 | 2 | 1 | 1 |
| 1 | 3 | 1 | 1 |
| . | . | . | . |
| . | . | . | . |
| . | . | . | . |
| 1 | 256 | 1 | 1 |
| 2 | 1 | −1 | 1 |
| 2 | 2 | −1 | 1 |
| 2 | 3 | −1 | 1 |
| . | . | . | . |
| . | . | . | . |
| . | . | . | . |
| 2 | 256 | −1 | 1 |
| 3 | 1 | 1 | 1 |
| 3 | 2 | 1 | 1 |
| 3 | 3 | 1 | 1 |
| . | . | . | . |
| . | . | . | . |
| . | . | . | . |
| 3 | 256 | 1 | 1 |
| 4 | 1 | −1 | 1 |
| 4 | 2 | −1 | 1 |
| 4 | 3 | −1 | 1 |
| . | . | . | . |
| . | . | . | . |
| . | . | . | . |
| 4 | 256 | −1 | 1 |
| * | * | * | * |
| 16 | 1 | −1 | 1 |
| 16 | 2 | −1 | 1 |
| 16 | 3 | −1 | 1 |
| . | . | . | . |
| . | . | . | . |

TABLE 1-continued

| Slice (k) | y value | RF pulse coefficient | |
|---|---|---|---|
| | | Centered slab | Half Offset slab |
| 16 | 256 | −1 | 1 |

We claim:

1. A method for obtaining measurements from which image data is obtained for providing a three-dimensional nuclear magnetic resonance (MR) magnitude contrast angiograph of fluid flowing in a preselected volume portion of a sample, within a logical x, y, and z axes coordinate system, comprising the steps of:
   (a) applying to said volume a main static magnetic field;
   (b) selecting a slab within said volume by
      (i) applying to said volume a magnetic field gradient in the logical z axis direction; and
      (ii) applying to said volume an RF pulse at a frequency band and of a strength to tip nuclear spins of material in said slab to create a nuclear magnetic signal;
   (c) applying to said volume a magnetic field gradient in the logical y axis direction for spatial phase encoding of said magnetic signal in the logical y axis dimension of said slab, wherein said magnetic field gradient in the logical y axis direction is a y axis phase encoding gradient;
   (d) applying to said volume a second magnetic field gradient in the logical z axis direction for spatial phase encoding of said magnetic signal in the logical z axis direction of said slab, wherein said magnetic field gradient in the logical z axis direction is a z axis phase encoding gradient;
   (e) applying to said volume a magnetic field gradient in the logical x axis direction for spatial encoding of said magnetic signal in the logical x axis direction, wherein said magnetic field gradient in the logical x axis direction is a readout gradient.
   (f) obtaining measurements of said nuclear magnetic signal while said readout gradient is being applied; and
   (g) repeating steps a through f multiple times to obtain a number of measurements to generate data from which a three dimensional image of said slab can be created; wherein said y axis and z axis phase encoding gradients are stepped through a combination of values requisite for the generation of a three dimensional image of said slab; and
wherein the phase angle of said RF pulse is rotated by a desired phase angle to allow arbitrary slab position in the logical z axis direction.

2. A method as described in claim 1 further comprising a step of applying an additional magnetic gradient to spoil said magnetic signal after the step of obtaining measurements of said magnetic signal.

3. A method as described in claim 1 further comprising a step of reconstructing said magnetic signals into an image data set using a three dimensional magnetic resonance reconstruction algorithm.

4. A method as described in claim 1 further comprising a step of repeating steps a through g for additional slabs in said volume.

5. A method as described in claim 4 wherein said step of obtaining acquires said measurements of said nuclear magnetic signal in an alternating manner from a plurality of slabs.

6. A method as described in claim 4 wherein the phase angle of said RF pulse is further rotated to move a slowly varying error noise to any edge of said slab.

7. A method as described in claim 6 further comprising a step of applying an additional magnetic gradient to spoil said magnetic signal after the step of obtaining measurements of said magnetic signal.

8. A method as described in claim 1 wherein the phase angle of said RF pulse is further rotated to move a slowly varying error noise to any edge of said slab.

9. A method as described in claim 1 further comprising
   (h) a step of repeating steps a through g for additional slabs in said volume; and
   (i) a step of applying an additional magnetic gradient to spoil said magnetic signal after the step of obtaining measurements of said magnetic signal.

10. A method as described in claim 9 wherein said step of obtaining acquires said measurements of said nuclear magnetic signal in an alternating manner from a plurality of slabs.

11. A method for obtaining measurements from which image data is obtained for providing a three-dimensional nuclear magnetic resonance (MR) magnitude contrast angiograph of fluid flowing in a preselected volume portion of a sample, within a logical x, y, and z axes coordinate system, comprising the steps of:
   (a) applying to said volume a main static magnetic field;
   (b) selecting a slab within said volume by
      (i) applying to said volume a magnetic field gradient in the logical z axis direction; and
      (ii) applying to said volume an RF pulse at a frequency band and of strength to tip nuclear spins of material in said slab to create a nuclear magnetic signal;
   (c) applying to said volume a magnetic field gradient in the logical y axis direction for spatial phase encoding of said magnetic signal in the logical y axis dimension of said slab, wherein said magnetic field gradient in the logical y axis direction is a y axis phase encoding gradient;
   (d) applying to said volume a second magnetic field gradient in the logical z axis direction for spatial phase encoding of said magnetic signal in the logical z axis direction of said slab, wherein said magnetic field gradient in the logical z axis direction is a z axis phase encoding gradient;
   (e) applying to said volume a magnetic field gradient in the logical x axis direction for spatial encoding of said magnetic signal in the logical x axis direction, wherein said magnetic field gradient in the logical x axis direction is a readout gradient.
   (f) obtaining measurements of said magnetic signal while said readout gradient is being applied;
   (g) repeating steps a through f multiple times to obtain a number of measurements to generate data from which a three dimensional image of said slab can be created; wherein said y axis and z axis phase encoding gradients are stepped through a combination of values requisite for the generation of a three dimensional image of said slab; and
   (h) repeating steps a through g for the imaging of a desired number of additional slabs, wherein said slabs are overlapped.

12. A method as described in claim 11 further comprising a step of applying an additional magnetic gradient to spoil said magnetic signal after the step of obtaining measurements of said nuclear magnetic signal.

13. A method as described in claim 11 further comprising a step of reconstructing said magnetic signals into an image data set using a three dimensional magnetic resonance reconstruction algorithm.

14. A method as described in claim 11 further comprising a step of repeating steps a through g for additional slabs in said volume.

15. A method as described in claim 14, wherein the phase angle of said RF pulse is rotated by a desired phase angle to move a slowly varying error noise to any edge of said slab.

16. A method as described in claim 15 further comprising a step of applying an additional magnetic gradient to spoil said magnetic signal after the step of obtaining measurements of said magnetic signal.

17. A method as described in claim 11 wherein the phase angle of said RF pulse is rotated by a desired phase angle to move a slowly varying error noise to any edge of said slab.

18. A method as described in claim 11 wherein said step of obtaining acquires said measurements of said nuclear magnetic signal in an alternating manner from a plurality of slabs.

19. A method as described in claim 11 further comprising
   (i) a step of repeating steps a through g for additional slabs in said volume; and
   (j) a step of applying an additional magnetic gradient to spoil said magnetic signal after the step of obtaining measurements of said magnetic signal.

20. A method as described in claim 19 wherein said step of obtaining acquires said measurements of said magnetic signal in an alternating manner from a plurality of slabs.

* * * * *